United States Patent
Seidel et al.

(10) Patent No.: US 9,755,400 B2
(45) Date of Patent: Sep. 5, 2017

(54) CIRCUIT FOR PRODUCING A LASER DIODE CONTROL SIGNAL

(75) Inventors: Juergen Seidel, Baltmannsweiler (DE); Reinhold Fiess, Durbach (DE); Juergen Hasch, Stuttgart (DE); Annette Frederiksen, Renningen (DE); Thomas Hilberath, Eningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 166 days.

(21) Appl. No.: 14/395,370

(22) PCT Filed: Apr. 17, 2012

(86) PCT No.: PCT/EP2012/056970
§ 371 (c)(1),
(2), (4) Date: Dec. 15, 2014

(87) PCT Pub. No.: WO2013/156055
PCT Pub. Date: Oct. 24, 2013

(65) Prior Publication Data
US 2015/0116673 A1    Apr. 30, 2015

(51) Int. Cl.
*H01S 5/062*    (2006.01)
*H01S 5/065*    (2006.01)
(Continued)

(52) U.S. Cl.
CPC ...... *H01S 5/06226* (2013.01); *G03B 21/2053* (2013.01); *H01S 5/0652* (2013.01);
(Continued)

(58) Field of Classification Search
CPC .. H01S 5/0427; H01S 5/06226; H01S 5/0652; H01S 5/06808
See application file for complete search history.

(56) References Cited

U.S. PATENT DOCUMENTS 5,283,793 A    2/1994    Shoji
5,283,802 A    2/1994    Hsiung
(Continued)

FOREIGN PATENT DOCUMENTS

EP    0667659    8/1995
GB    2387285    10/2003
(Continued)

OTHER PUBLICATIONS

International Search Report for PCT/EP2012/056970, issued on Dec. 20, 0212.

*Primary Examiner* — Yuanda Zhang
*Assistant Examiner* — Michael Carter
(74) *Attorney, Agent, or Firm* — Norton Rose Fulbright US LLP; Gerard Messina

(57) ABSTRACT

A circuit is provided for generating a modulated laser diode control signal from a laser diode control signal, the circuit having an RF modulator for modulating the laser diode control signal with a modulation signal; the circuit having adjustment means for adjusting the RF modulator; the adjustment means being configured or configurable as a function of at least one laser diode operating information item. Furthermore, a laser diode receptacle is described as having such a circuit, a projector, particularly an image projector having such a laser diode receptacle, an image projector having such a laser diode receptacle and a laser diode, as well as a method for adjusting an RF modulator of such a circuit and a method for producing such a laser diode receptacle.

20 Claims, 6 Drawing Sheets

(51) Int. Cl.
  *H01S 5/068* (2006.01)
  *H04N 9/31* (2006.01)
  *G03B 21/20* (2006.01)
  *H01S 5/042* (2006.01)

(52) U.S. Cl.
  CPC ....... *H01S 5/06808* (2013.01); *H04N 9/3135* (2013.01); *H04N 9/3161* (2013.01); *H01S 5/0427* (2013.01); *H01S 5/0622* (2013.01)

(56) References Cited

U.S. PATENT DOCUMENTS

| | | | | |
|---|---|---|---|---|
| 5,444,564 | A * | 8/1995 | Newberg | H03H 7/40 333/17.3 |
| 6,768,472 | B2 * | 7/2004 | Alexopoulos | H03H 7/40 330/144 |
| 7,822,086 | B2 | 10/2010 | Brown et al. | |
| 7,967,452 | B2 | 6/2011 | Itoh et al. | |
| 2002/0104957 | A1 * | 8/2002 | Liess | G01P 3/366 250/221 |
| 2005/0140925 | A1 * | 6/2005 | Yavid | G02B 27/48 353/20 |
| 2005/0237127 | A1 * | 10/2005 | Van Delden | H01H 59/0009 333/105 |
| 2009/0031061 | A1 | 1/2009 | Lee | |
| 2009/0174496 | A1 * | 7/2009 | Van Bezooijen | H03F 1/56 333/17.3 |
| 2009/0262262 | A1 | 10/2009 | Itoh et al. | |
| 2009/0310641 | A1 * | 12/2009 | Kimura | G02B 6/0026 372/99 |
| 2010/0260025 | A1 * | 10/2010 | Minemura | G11B 20/10009 369/59.22 |
| 2012/0140784 | A1 * | 6/2012 | Quirk | G02B 27/48 372/29.015 |

FOREIGN PATENT DOCUMENTS

| | | |
|---|---|---|
| JP | 61206322 A | 9/1986 |
| JP | H05-41555 A | 2/1993 |
| JP | H05-075192 * | 3/1993 |
| JP | H10-256629 A | 9/1998 |
| JP | 2002-335-41 A | 11/2002 |
| JP | 2003124562 A | 4/2003 |
| JP | 2005-116547 A | 4/2005 |
| JP | 2009-026889 A | 2/2009 |
| JP | 2010147161 A | 7/2010 |
| JP | 201196742 A | 5/2011 |
| WO | WO 97/02507 | 1/1997 |
| WO | 2007034783 A1 | 3/2007 |
| WO | 2008029892 A1 | 3/2008 |

\* cited by examiner

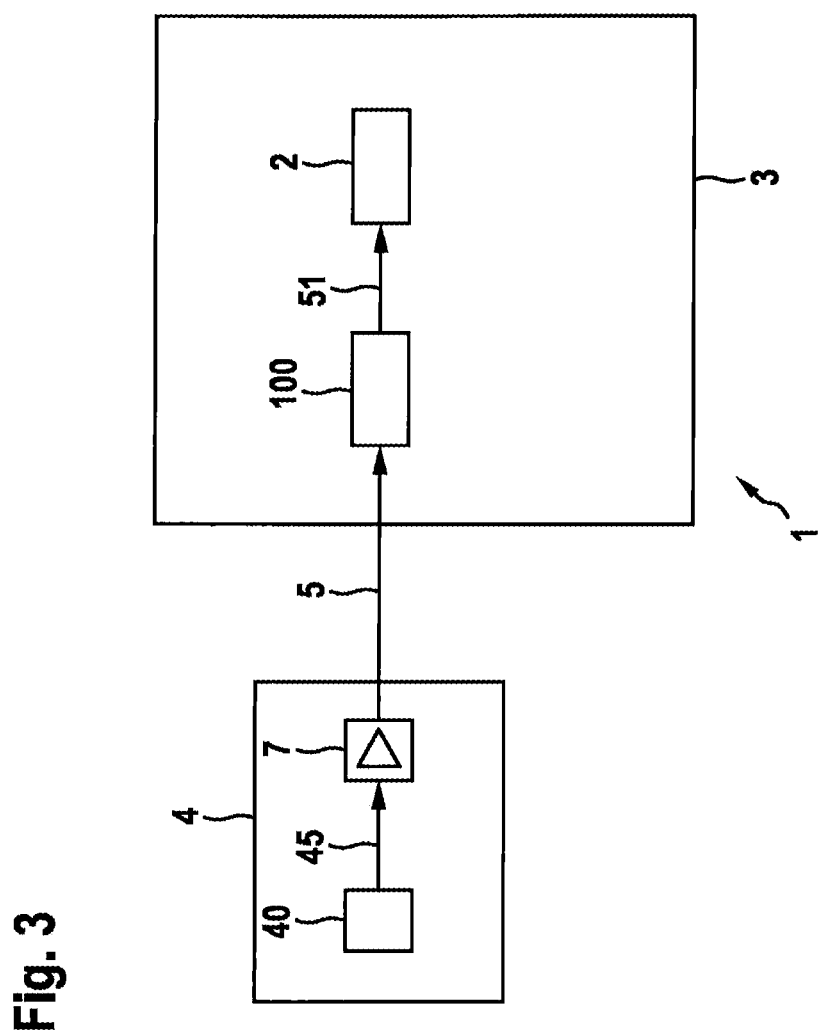

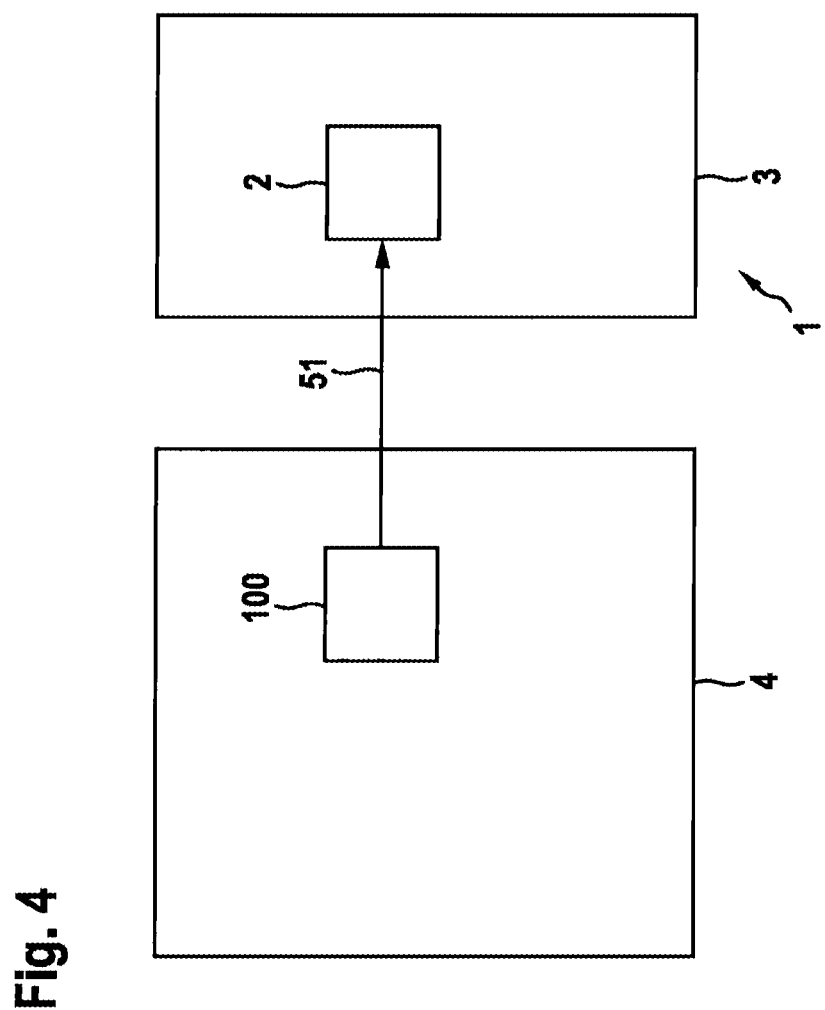

CIRCUIT FOR PRODUCING A LASER DIODE CONTROL SIGNAL

FIELD OF THE INVENTION

The present invention relates to a circuit for producing a laser diode control signal.

BACKGROUND INFORMATION

The use of laser sources, particularly in a laser-based image projection system, makes possible the production of images having a very large color space. However, the image quality is reduced by so-called speckles. Speckles are created when coherent light, such as laser light, hits a surface and is scattered there, which is the case, for example, when laser light impinges upon a projection screen. In this instance, at the point of observation, the light waves of all scattering centers are superposed on one another and destructive interferences occur, for one thing, in which the superposed light waves are mutually extinguished, whereby dark points are created in the point of observation, and for another thing, constructive interferences occur, in which superposing light waves are amplified, so that bright points of light are created. This leads to an overall grainy image impression, the so-called laser speckle. Since this phenomenon reduces the quality of the image, a reduction in speckles would be very desirable.

In Published International Patent Appln. No. WO 97/02507 A, an optical system is described which includes a rotating mirror which is surrounded by a conical reflector. Based on the rotation of the rotating mirror, the laser light is guided over the lateral surface of the conical reflector. Based on the rapid motion connected with this, a mixing takes place of the interference phenomena, whereby the latter can no longer be visually perceived.

The disadvantage of this device is, however, that mechanically moved components are used, so that the implementation, particularly for mobile projectors, is comparatively costly. In addition, miniaturization, which is necessary for mobile systems, is not possible.

It is therefore the object of the present invention, to provide a circuit, a laser diode receptacle, an image projector, an image projector having a laser diode, a method for adapting a circuit as well as a manufacturing method, which do not have the disadvantages of the related art and are particularly comparatively simple to implement.

SUMMARY

The present invention relates to a circuit for producing a laser diode control signal.

The essence of the invention is that circuit (100) has an RF modulator for modulating the laser diode control signal using a modulation signal, the circuit also having adjustment means for adjusting the RF modulator, the adjustment means being configured or configurable as a function of at least one laser diode operating information item.

The circuit according to the present invention, the laser diode receptacle according to the present invention, the image projector according to the present invention, the method according to the present invention for adjusting an RF modulator in a circuit for producing a modulated laser diode control signal from a laser diode control signal, as well as the manufacturing method have the advantage over the related art that an electronic attainment of the object of speckle reduction is created which has an optimum (power) adjustment of the RF modulator or the modulation signal based on the dependence of the configuration of the adjustment means on the laser diode operating information. Because of the adjustment, it is advantageously made possible to couple as large a part as possible of the electrical power of the laser diode control signal into the laser diode. The proportion of the reflected power is held to as low as possible. It is thereby possible to generate laser radiation from the available electric power, with great efficiency.

This makes possible a substantial improvement of the quality of the image of laser-based projection methods, because, in particular, a comparatively good speckle reduction is possible. The attainment of the object according to the present invention is advantageously electronic. One is able to do without moving parts. Furthermore, it is of advantage that the circuit is able to be miniaturized, and is therefore able to be integrated into a projection system in various ways. The circuit is further advantageously adaptable to various laser diodes and length of lines, the adaptation taking place automatically. Moreover, it is advantageous that the circuit is able to be combined with other speckle-reducing measures and that the circuit is able to be operated using laser diodes from different manufacturers. The circuit may be used for the most varied, laser-based projection systems, particularly because, according to the present invention, an effective reduction in the coherence lengths is provided directly at the laser diode. The present invention is therefore also particularly suitable for mobile applications. In this instance, possible laser-based projection systems are both simple systems, such as laser pointers or laser distance meters, and imaging systems such as laser projectors. By adapting the RF modulators and the modulation signal to the using situation, the power of the modulation signal is utilized in optimal fashion, so that a comparatively good speckle reduction results. It is also advantageous that the implementation of the circuit is able to take place comparatively cost-effectively. It is advantageously possible that the circuit according to the present invention for speckle reduction is able to be used in all laser-based image projection systems, for instance, in cell phone projectors or head-up displays.

The adjustment means of the circuit, according to the present invention, are advantageously configured once during production of the circuit and remain in this configuration. The configuring is able to take place to fit the operating parameters of a certain type of laser diodes or to fit the selected laser diode. It is also possible, however, that the adjustment means remain configurable, for instance, in a running projection operation continuously as a function of laser diode operating information. The adjusting means may advantageously also be configurable for another laser diode, so that one is able to exchange the laser diodes in the laser diode receptacle.

The modulation of the laser diode control signal has the effect of the starting of oscillations of various oscillating modes of the laser diode and/or the tuning of the laser wavelength within one or more oscillating modes, and with that a reduction in the coherence length of the laser light by, for instance, a common starting of oscillations of comparatively many oscillating modes of the laser diode. For comparatively large observation time periods (compared to the modulation period), on average, a state develops having a broadened wavelength spectrum. This broadened wavelength spectrum has the effect of reducing the coherence length. The reduced coherence length advantageously effects a lower contrast in the speckle pattern.

The circuit is preferably integrated into a laser diode receptacle, the laser diode receptacle being able to be a receptacle socket or even a laser diode housing, for example. The circuit may also, however, be implemented using separate subassemblies. By the adjustment of the RF modulator and the modulation signal, advantageously the power generated by the RF modulator is coupled into the laser diode for as effective as possible a modulation of the operation of the laser diode. The circuit is preferably usable for a plurality of laser diodes or for a plurality of laser diodes there is, in each case, one circuit present, thus, for example, for three laser diodes made up of one red, one green and one blue laser diode.

The adjustment means may be designed discretely or as an integrated circuit. The adjustment means are preferably constructed of active components. The adjustment means preferably have tunable capacitances (e.g. a varactor diode). Furthermore, preferably discrete capacitors may be switched in, which further preferred are developed as a microelectromechanical system (MEMS) or as a MOSFET (metal oxide semiconductor field effect transistor). The changing of the output impedance level of the RF modulator is preferably able to be achieved by the switching off/in of parallel transistor output stages. Further preferred, inductances are able to be switched in/off, the inductances being preferably be connected in series.

According to one preferred refinement, it is provided that the laser diode operating information encompasses a laser diode operating current intensity I and/or a laser diode operating voltage U.

In this instance, only the portions of the high-frequency modulation are recorded in absolute value and phase, and are drawn upon for generating the quality signal.

This makes it advantageously possible for the adjustment of the RF modulator to the operating parameters of the laser diode to be comparatively precise.

The recording of the high-frequency portion of the laser diode operating current intensity and the laser diode operating voltage may take place in a different manner:

In one implementation, the two signals are detected with the aid of a rapid scanning element in the time interval, and the amount and phase of the signal are determined by scanning resolved in time.

In one further specific embodiment, the two signals are detected by mixing with a high-frequency reference signal of the same or similar frequency. From the signal created, the absolute value and the phase of the high-frequency portion are ascertained.

According to one preferred refinement, it is provided that the circuit for generating a quality signal is configured from the ratio of the laser diode operating voltage U to the laser diode operating current intensity I. Because of the generation of the quality signal, advantageously only the evaluation of the quality signal is required.

According to one preferred refinement, it is provided that the circuit have a directional coupler for measuring the laser diode operating information. Because of the directional coupler, it is advantageously possible to obtain information regarding the modulation power fed in by the RF modulator and the modulation power reflected by the laser diode. By the comparison of the modulation power fed in to the reflected modulation power, the ascertainment of the quality signal is also possible.

According to another preferred refinement, it is provided that the RF modulator, for generating the modulation signal, is configured having a modulation frequency greater than, or equal to 150 MHz and less than, or equal to 1.5 GHz, and preferably greater than, or equal to 200 MHz and less than, or equal to 1.0 GHz. For imaging projection systems, in which a laser beam writes the image pixel by pixel, there is yielded the lower limit for the modulation frequency from the product of the pixel number of the projected image and the image repetition frequency of the projection system. This lower limit for the modulation frequency may still be multiplied by an additional factor which has the value of 2 or 3 or more, for example. By this high-frequency modulation of the laser diode control signal, an especially efficient speckle reduction is advantageously possible.

According to one preferred refinement it is provided that the adjustment means for adjusting the RF modulator is configured by adjusting the modulation frequency of the modulation signal and/or by impedance adjustment of the output impedance of the RF modulator. Thereby advantageously a variable and comparatively efficient adjustment of the RF modulator is possible. The adjustment of the modulation frequency of the modulation signal at constant output impedance of the RF modulator or the impedance adjustment of the output impedance of the RF modulator takes place at a constant modulation frequency of the modulation signal.

According to one preferred refinement it is provided that the adjustment means are configured so that the laser diode control signal is modulated using the modulation signal or using an additional modulation signal. The additional modulation signal is created, in this case, particularly by iteration and corresponds to an improved adjustment of the modulation signal (possibly based on changed operating parameters of the laser diode). The additional modulation signal may, for instance, have a different modulation frequency, but it may also have the same modulation frequency as the modulation signal. The adjustment means may be (repeatedly) reconfigured, for example, in the projection operation, so that advantageously a respectively adjusted configuration is possible during the projection operation.

One further subject matter refers to a laser diode receptacle, in particular, a receptable socket or a laser diode housing having a circuit according to one of the preceding specific embodiments.

One further subject matter refers to a projector, in particular, an image projector having a laser diode receptacle having a circuit according to one of the preceding specific embodiments. Two, three or more laser diode receptacles are preferably provided.

One further subject matter refers to a projector, in particular, an image projector having a laser diode receptacle having a circuit according to one of the preceding specific embodiments, and having a laser diode. Two, three or more laser diode receptacles are preferably provided.

One further subject matter relates to a method for adjusting an RF modulator in a circuit to generate a modulated laser diode control signal from a laser diode control signal.

According to one preferred refinement, it is provided that, as the laser diode operating information, a laser diode operating current intensity and/or a laser diode operating voltage be measured. This makes it advantageously possible for the adjustment of the RF modulator to the operating parameters of the laser diode to be comparatively precise.

According to one preferred refinement, it is provided that the laser diode operating information is measured by a directional coupler. Because of the directional coupler, it is advantageously possible to obtain information regarding the modulation power fed in by the RF modulator and the modulation power reflected by the laser diode. By the comparison of the modulation power, fed in to the reflected modulation power, the ascertainment of the quality signal is also possible. The high-frequency modulation signal is preferably superposed additively onto the laser control pulse. In the case of image projectors, the superposition preferably takes place before or after the video amplifier.

According to another preferred refinement, it is provided that the laser diode control signal is modulated using the modulation signal, the modulation signal having a modulation frequency greater than, or equal to 150 MHz and less than, or equal to 1.5 GHz, and preferably greater than, or equal to 200 MHz and less than, or equal to 1.0 GHz. For imaging projection systems, in which a laser beam writes the image pixel by pixel, there is yielded the lower limit for the modulation frequency from the product of the pixel number of the projected image and the image repetition frequency of the projection system. This lower limit for the modulation frequency is preferably still to be multiplied by an additional factor having the value 2 or greater. By this high-frequency modulation of the laser diode control signal, an especially efficient speckle reduction is advantageously possible.

According to one preferred refinement it is provided that the adjustment means adjusts the modulation frequency of the modulation signal. According to another preferred refinement it is provided that the adjustment means adjusts the output impedance of the RF modulator. Thereby advantageously a variable and comparatively efficient adjustment of the RF modulator and of the modulation signal is possible. The adjustment of the modulation frequency of the modulation signal at constant output impedance of the RF modulator or the impedance adjustment of the output impedance of the RF modulator takes place at a constant modulation frequency of the modulation signal.

According to one preferred refinement it is provided that, in a third step, at least one additional laser diode operating information item is ascertained, in a fourth step the adjustment means of the circuit being configured as a function of the additional laser diode operating information for the adjustment of the RF modulator for the generation of a further modulation signal. The additional modulation signal is created, in this case, particularly by iteration and corresponds to an improved adjustment of the modulation signal (possibly based on changed operating parameters of the laser diode). The additional modulation signal may, for instance, have a different modulation frequency, but it may also have the same modulation frequency as the modulation signal. The adjustment means may be (repeatedly) reconfigured, for example, in the projection operation, so that advantageously a respectively adjusted configuration is possible during the projection operation.

Exemplary embodiments of the present invention are illustrated in the drawings and explained in greater detail in the following description.

BRIEF DESCRIPTION OF THE DRAWINGS

FIG. 3 shows schematically an image projector and a laser diode receptacle according to one exemplary embodiment, FIG. 4 shows schematically an image projector according to an exemplary embodiment.

DETAILED DESCRIPTION

In the various figures, identical parts have always been provided with the same reference symbols and are therefore usually labeled or mentioned only once.

Figure 1:
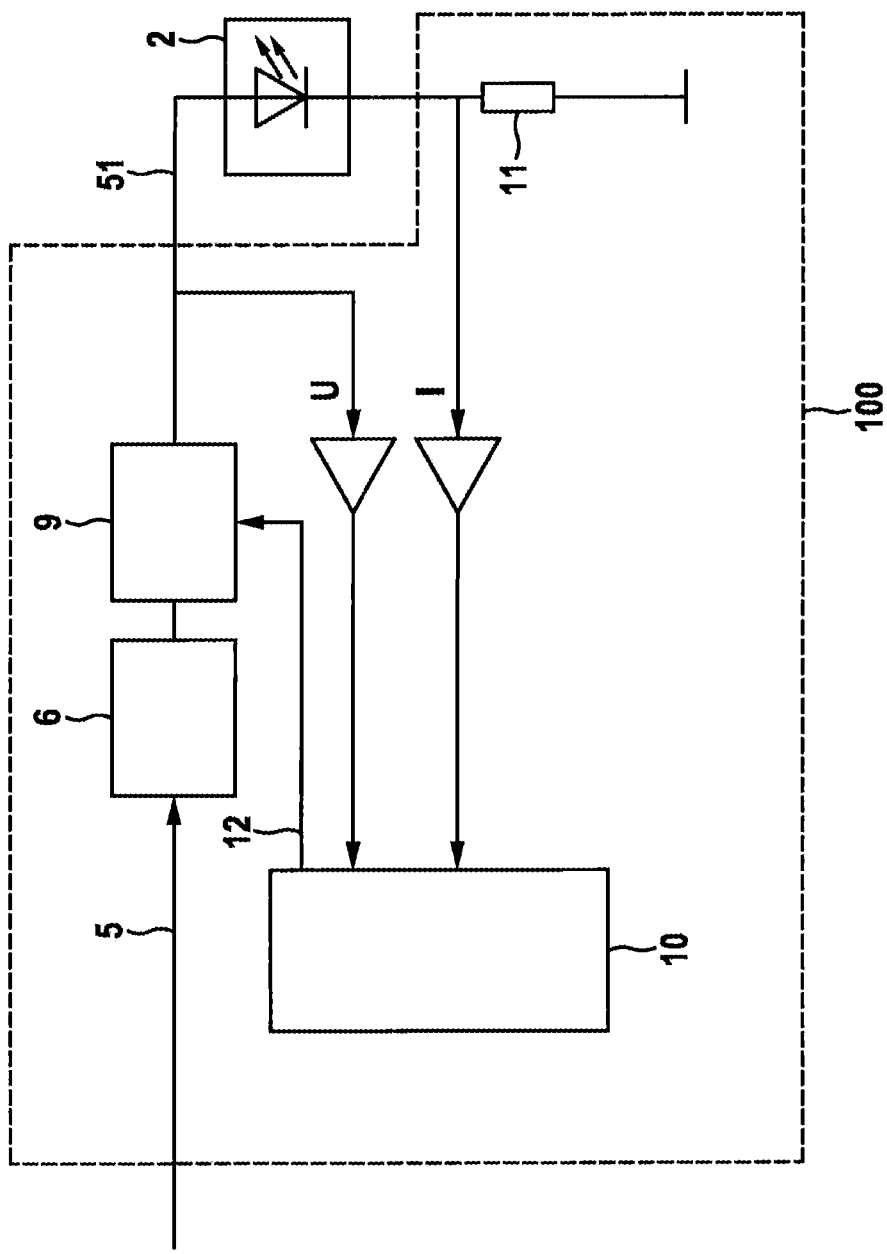
FIG. 1 shows schematically a circuit according to an exemplary embodiment.

FIG. 1 schematically shows a circuit 100, according to an exemplary embodiment of the present invention, circuit 100 including the components situated in the area enclosed by the dashed line. At an input, circuit 100 has a laser diode control signal 5. Circuit 100 has an RF modulator 6, an adjustment circuit 9, a resistor 11 and an evaluation circuit 10. Laser diode control signal 5 may be an unmodulated signal or one that has already been modulated, a continuous-wave signal or an intermittent signal. RF modulator 6 generates a modulation signal, using which laser diode control signal 5 is modulated. Laser diode control signal 5 is thus converted by RF modulator 6 and the subsequent adjustment circuit 9 to a modulated laser diode control signal 51. Modulated laser diode control signal 51 actuates a laser diode 2. A laser diode operating voltage U and a laser diode operating current intensity I are measured. From the laser diode operating voltage U and the laser diode operating current intensity I, a quality signal 12 is ascertained in the evaluation circuit 10, which is transmitted directly to adjustment circuit 9.

By a high-frequency modulation of laser diode control signals having frequencies in the range between 150 MHz and 1.5 GHz, speckles are able to be reduced. In particular, because of this modulation, more oscillation modes of the laser diode begin to oscillate, which leads to a broadening of the light spectrum emitted by the laser diode. The tuning of the laser diode disturbs the temporal coherence of the emitted laser radiation, and thus leads to a reduction in the coherence length. This shows itself in a projected image having clearly reduced speckle. It is not only that the speckle contrast becomes reduced, but the speckles themselves become more fine-grained and are thus less interfering to the observer. This high-frequency modulation of the laser diode control signal may preferably be integrated in various ways into a projection system by an RF driver. Circuit 100 may be integrated directly on the laser diode into the laser diode housing or into the laser diode receptacle. Circuit 100 may, however, also be situated outside the laser diode housing. For the adjustment of RF modulator 6 and of the modulation signal, two methods are provided (to be used individually or in common). Firstly, the modulation frequency adjustment at preferably constant output impedance of the modulator, and, Secondly, the impedance adjustment, i.e. the variation of the output impedance of the modulator by active and/or passive components. This may preferably take place by tunable capacitances or switching in or off transistors in the adjustment circuit.

Figure 2:
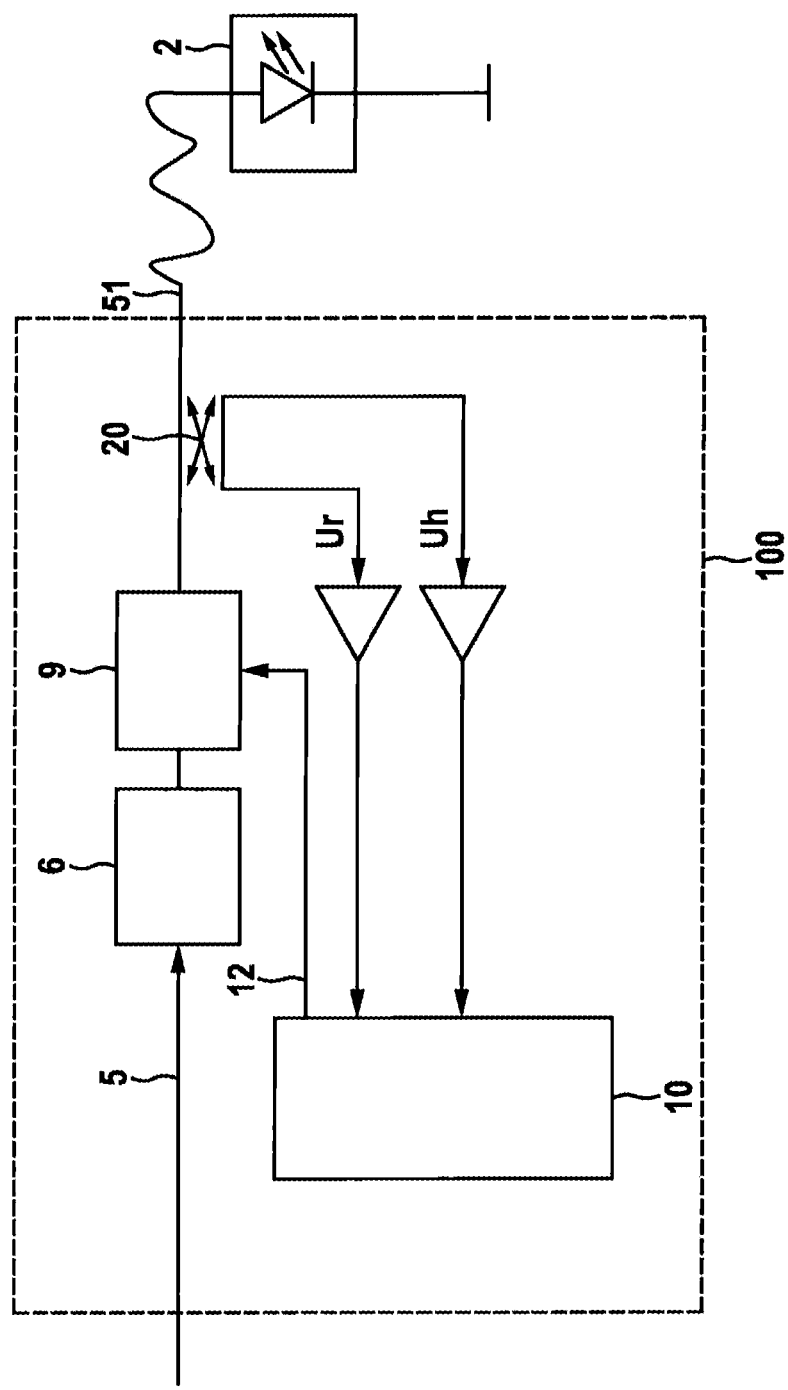
FIG. 2 shows schematically a circuit according to a further exemplary embodiment.

FIG. 2 schematically shows a circuit 100, according to an exemplary embodiment, circuit 100 including the components situated in the area enclosed by the dashed line. This circuit 100 differs from circuit 100 shown in FIG. 1 in that a directional coupler 20 is situated in it. From laser diode control signal 51, directional coupler 20 ascertains a voltage Ur and a voltage Uh. In this case, voltage Uh is used as a measure for the magnitude of the power fed in (forward-running wave) and voltage Ur as a measure for the magnitude of the reflected power (backwards-running wave). Voltage Ur and voltage Uh are evaluated in evaluation circuit 10, thus ascertaining quality signal 12. Quality signal 12 is transmitted directly to adjustment circuit 9.

FIG. 3 shows schematically an image projector 4 and a laser diode receptacle 1 according to one exemplary specific embodiment, Laser diode receptacle 1 has a housing 3. Laser diode receptacle 1 accommodates laser diode 2. In this specific embodiment, circuit 100 according to the present invention is preferably situated in laser diode receptacle 1, according to FIG. 1. Image projector 4, or rather an image electronic unit 40, sends an image signal 45 to a video amplifier 7. Video amplifier 7 sends a laser diode control signal 5, which is already modulated with image information, to circuit 100. What was described for FIG. 1 applies to circuit 100. In circuit 100, modulated laser diode control signal 51 is generated from laser diode control signal 5. Circuit 100 may be integrated into the housing for the video electronic system. Circuit 100 may, however, also be situated outside the housing for the video electronics system.

FIG. 4 shows schematically a projector 4, particularly an image projector 4 according to an exemplary specific embodiment of the present invention. Image projector 4 preferably has the circuit according to the present invention from FIG. 2. Laser diode control signal 51 is transmitted by image projector 4 to a conventional laser diode receptacle 1, or rather to laser diode 2.

Figure 5A:
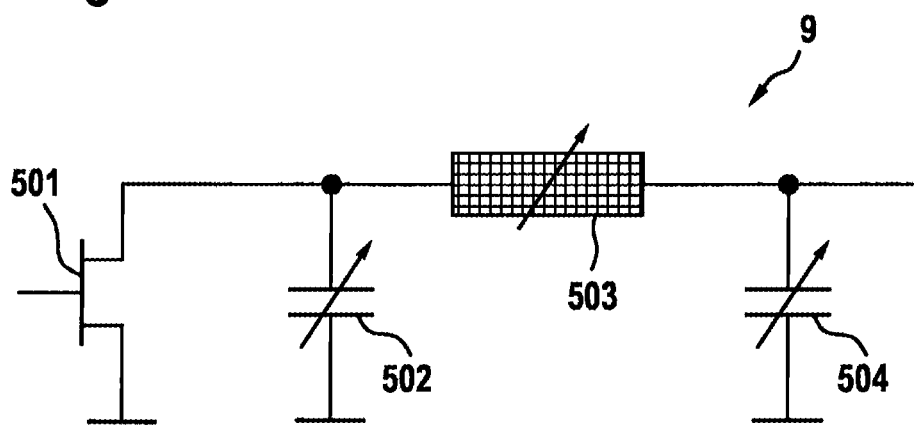
FIGS. 5a-5d show schematically exemplary embodiments of adjustment circuits.
Figure 5B:
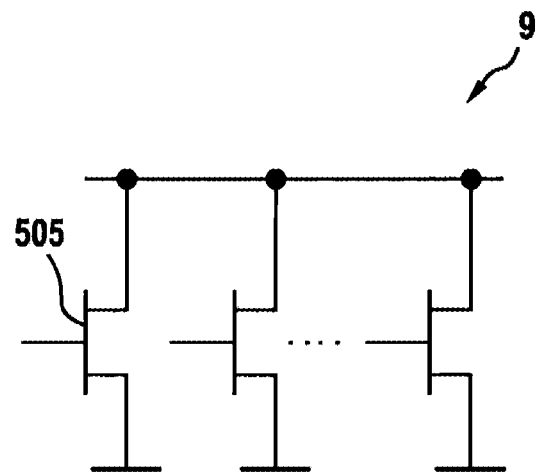
Figure 5C:
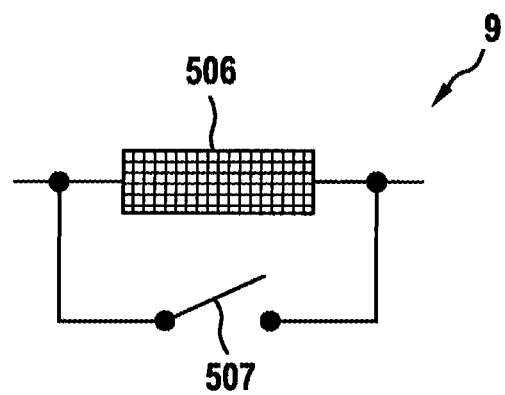

FIGS. 5a, 5b, 5c and 5d schematically show exemplary specific embodiments of adjustment circuits. FIG. 5a shows an adjustment circuit 9 having a transistor 501, two adjustable capacitors 502, 504 and an adjustable inductance 503 in the form of a pi section. The pi section represents a specific embodiment of a low pass, and it transforms the current and voltage ratio in a desired manner. Additional specific embodiments are known (another order of the filter, the T-structure etc.). FIG. 5b shows an additional adjustment circuit 9 having three transistors 505 connected in parallel, the three points being intended to indicate that additional transistors may also be connected in parallel. Using this circuit, a changeable impedance level is set. For this purpose, a plurality of transistors is switched on or off as a function of the desired impedance level. FIG. 5c shows an additional element of adjustment circuit 9 having an inductance 506 that is able to be switched on and off via a switch 507. With the aid of this system, the imaginary part of the impedance may be changed by the absolute value of the inductance. By the series connection of a plurality of elements, an imaginary part of the impedance may be adjusted in a plurality of steps.

Figure 5D:
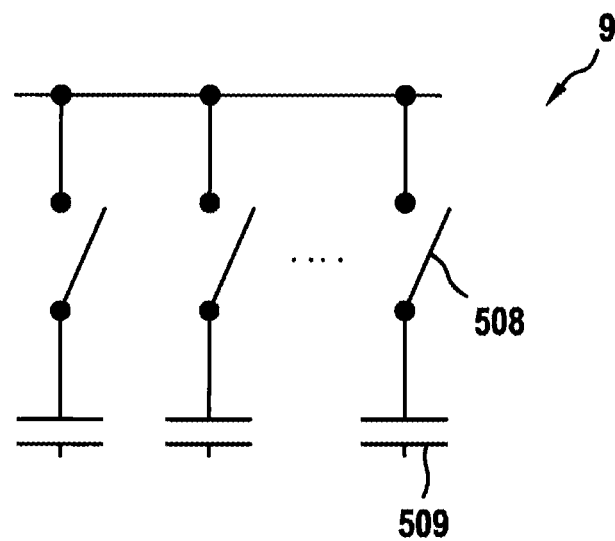

FIG. 5d shows a further element of adjustment circuit 9 having three capacitors 509, the capacitors each being able to be switched in and off via switch 508. The three points indicate that even further capacitors may be situated there. Because of the parallel connection of the capacitors, the imaginary part of the impedance may also be set in steps.

What is claimed is:

1. A circuit for generating a modulated laser diode control signal from a laser diode control signal, comprising:
    an RF modulator including an input for receiving the laser diode control signal and for modulating the laser diode control signal using a modulation signal;
    an adjustment arrangement for adjusting the RF modulator, the adjustment arrangement being configured or configurable as a function of at least one laser diode operating information wherein:
       the adjustment arrangement includes a plurality of circuit elements that are selectively activated according to a plurality of different configurations,
       the adjustment arrangement includes an input for receiving a signal based on the laser diode operating information,
       the adjustment arrangement is selectively configured to assume each configuration of the circuit elements as a function of a corresponding value of the signal based on the laser diode operating information,
       each configuration of the adjustment arrangement adjusts at least one of a modulation frequency and an output impedance of the RF modulator, and
       the laser diode operating information encompasses at least one of a laser diode operating current intensity I and a laser diode operating voltage U; and
    an evaluation circuit configured to generate a quality signal from a ratio of the laser diode operating voltage U to the laser diode operating current intensity I.

2. The circuit as recited in claim 1, further comprising:
    a directional coupler for measuring the laser diode operating information.

3. The circuit as recited in claim 1, wherein the RF modulator, for generating the modulation signal, is configured with a modulation frequency greater than, or equal to 150 MHz and less than, or equal to 1.5 GHz.

4. The circuit as recited in claim 1, wherein the RF modulator, for generating the modulation signal, is configured with a modulation frequency greater than, or equal to 200 MHz and less than, or equal to 1.0 GHz.

5. The circuit as recited in claim 1, wherein the adjustment arrangement is configured so that the laser diode control signal is modulated using one of the modulation signal and an additional modulation signal.

6. The circuit as recited in claim 1, wherein the plurality of circuit elements includes:
    a transistor,
    a plurality of adjustable capacitors, and
    an adjustable inductance.

7. The circuit as recited in claim 1, wherein the plurality of circuit elements includes:
    a plurality of transistors connected in parallel.

8. The circuit as recited in claim 1, wherein the plurality of circuit elements includes:
    a switch; and
    an inductor that is switched on and off by the switch.

9. The circuit as recited in claim 1, wherein the plurality of circuit elements includes:
    a plurality of capacitors; and
    a plurality of switches, each capacitor being turned on and off by a respective one of the plurality of switches.

10. A laser diode receptacle, comprising:
    a circuit for generating a modulated laser diode control signal from a laser diode control signal, the circuit including:
       an RF modulator including an input for receiving the laser diode control signal and for modulating the laser diode control signal using a modulation signal;
       an adjustment arrangement for adjusting the RF modulator, the adjustment arrangement being configured or configurable as a function of at least one laser diode operating information, wherein:
          the adjustment arrangement includes a plurality of circuit elements that are selectively activated according to a plurality of different configurations,
          the adjustment arrangement includes an input for receiving a signal based on the laser diode operating information,
          the adjustment arrangement is selectively configured to assume each configuration of the circuit elements as a function of a corresponding value of the signal based on the laser diode operating information, each configuration of the adjustment arrangement adjusts at least one of a modulation frequency and an output impedance of the RF modulator, and the laser diode operating information encompasses at least one of a laser diode operating current intensity I and a laser diode operating voltage U; and an evaluation circuit configured to generate a quality signal from a ratio of the laser diode operating voltage U to the laser diode operating current intensity I.

11. A projector, comprising:

a laser diode receptacle including a circuit for generating a modulated laser diode control signal from a laser diode control signal, the circuit including:

an RF modulator including an input for receiving the laser diode control signal and for modulating the laser diode control signal using a modulation signal;

an adjustment arrangement for adjusting the RF modulator, the adjustment arrangement being configured or configurable as a function of at least one laser diode operating information, wherein the laser diode control signal is an image data signal, wherein:

the adjustment arrangement includes a plurality of circuit elements that are selectively activated according to a plurality of different configurations, the adjustment arrangement includes an input for receiving a signal based on the laser diode operating information, the adjustment arrangement is selectively configured to assume each configuration of the circuit elements as a function of a corresponding value of the signal based on the laser diode operating information, each configuration of the adjustment arrangement adjusts at least one of a modulation frequency and an output impedance of the RF modulator, and the laser diode operating information encompasses at least one of a laser diode operating current intensity I and a laser diode operating voltage U; and an evaluation circuit configured to generate a quality signal from a ratio of the laser diode operating voltage U to the laser diode operating current intensity I.

12. The projector as recited in claim 11, wherein the projector is an image projector.

13. The projector as recited in claim 12, further comprising a laser diode.

14. A method for adjusting an RF modulator in a circuit for producing a modulated laser diode control signal from a laser diode control signal, wherein the circuit has an RF modulator including an input for receiving the laser diode control signal and for modulating the laser diode control signal using a modulation signal, the method comprising:

ascertaining at least one laser diode operating information;

configuring, as a function of the laser diode operating information, an adjustment arrangement of the circuit for an adjustment of the RF modulator for producing the modulation signal, wherein the configuring includes:

receiving, by the adjustment arrangement a signal based on the laser diode operating information, selectively activating a plurality of circuit elements of the adjusting arrangement according to one of a plurality of different configurations, as a function of a corresponding value of the signal based on the laser diode operating information, wherein each configuration of the adjustment arrangement adjusts at least one of a modulation frequency and an output impedance of the RF modulator, wherein the laser diode operating information encompasses at least one of a laser diode operating current intensity I and a laser diode operating voltage U; and generating a quality signal from a ratio of the laser diode operating voltage U to the laser diode operating current intensity I.

15. The method as recited in claim 14, further comprising measuring at least one of a laser diode operating current intensity I and a laser diode operating voltage U as the laser diode operating information.

16. The method as recited in claim 14, wherein the laser diode operating information includes a voltage Uh running forward and a reflected voltage Ur that are measured using a directional coupler.

17. The method as recited in claim 14, further comprising modulating the laser diode control signal with the modulation signal, the modulation signal having a modulation frequency greater than, or equal to 150 MHz and less than, or equal to 1.5 GHz.

18. The method as recited in claim 14, further comprising modulating the laser diode control signal with the modulation signal, the modulation signal having a modulation frequency greater than, or equal to 200 MHz and less than, or equal to 1.0 GHz.

19. The method as recited in claim 14, wherein the adjustment arrangement adjusts an output impedance of the RF modulator.

20. The method as recited in claim 14, further comprising:

ascertaining at least one additional laser diode operating information item;

configuring the adjustment arrangement as a function of the additional laser diode operating information for the adjustment of the RF modulator for generating an additional modulation signal.

* * * * *